United States Patent
Proell et al.

(10) Patent No.: US 7,512,023 B2
(45) Date of Patent: Mar. 31, 2009

(54) MEMORY AND METHOD FOR IMPROVING THE RELIABILITY OF A MEMORY HAVING A USED MEMORY REGION AND AN UNUSED MEMORY REGION

(75) Inventors: Manfred Proell, Dorfen (DE); Stephan Schroeder, Munich (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 11/541,442

(22) Filed: Sep. 29, 2006

(65) Prior Publication Data

US 2007/0133322 A1 Jun. 14, 2007

(30) Foreign Application Priority Data

Sep. 30, 2005 (DE) .................. 10 2005 046 981

(51) Int. Cl.
*G11C 7/00* (2006.01)
(52) U.S. Cl. .................. 365/200; 365/201; 365/225.7
(58) Field of Classification Search .................. 365/200, 365/201, 225.7
See application file for complete search history.

(56) References Cited

U.S. PATENT DOCUMENTS

| | | | | |
|---|---|---|---|---|
| 4,566,102 A * | 1/1986 | Hefner | .......................... | 714/7 |
| 5,134,584 A * | 7/1992 | Boler et al. | .................. | 365/200 |
| 5,208,782 A * | 5/1993 | Sakuta et al. | .......... | 365/230.03 |
| 5,293,079 A * | 3/1994 | Knoch | .......................... | 327/31 |
| 5,295,101 A * | 3/1994 | Stephens et al. | ............ | 365/200 |
| 5,299,160 A * | 3/1994 | Mori | .......................... | 365/200 |
| 5,323,353 A * | 6/1994 | Griffus et al. | ................ | 365/226 |
| 5,495,447 A * | 2/1996 | Butler et al. | ................ | 365/200 |
| 5,594,273 A * | 1/1997 | Dasse et al. | .................. | 257/620 |
| 5,668,763 A | 9/1997 | Fujioka et al. | | |
| 5,808,947 A * | 9/1998 | McClure | ...................... | 365/201 |
| 5,841,709 A | 11/1998 | McClure | | |
| 5,898,629 A * | 4/1999 | Beffa et al. | .................. | 365/201 |
| 6,661,719 B1 * | 12/2003 | Shih et al. | .................... | 365/201 |
| 7,277,337 B1 * | 10/2007 | Co et al. | ...................... | 365/200 |
| 2001/0005014 A1 * | 6/2001 | Koshikawa | .................... | 257/1 |
| 2001/0009523 A1 * | 7/2001 | Maeno | ........................ | 365/201 |
| 2003/0085731 A1 * | 5/2003 | Iwase et al. | .................... | 326/16 |
| 2006/0203599 A1 * | 9/2006 | Doyle et al. | ........... | 365/230.06 |

* cited by examiner

*Primary Examiner*—Hoai V Ho
*Assistant Examiner*—Fernando N Hidalgo
(74) *Attorney, Agent, or Firm*—Slater & Matsil, L.L.P.

(57) ABSTRACT

A method for improving the reliability of a memory having a used memory region and an unused memory region, wherein defect memory elements in the used memory region can be substituted by functional memory elements in the unused memory region, having the steps of providing the used memory region with a first stress sequence; and providing the unused memory region with a second stress sequence.

10 Claims, 5 Drawing Sheets

| clamped state (CA12) | TM bit (used) | selected HG region |
|---|---|---|
| 0 | 0 | 1 |
| 0 | 1 | 0 |
| 1 | 0 | 0 |
| 1 | 1 | 1 | pin 1

MEMORY AND METHOD FOR IMPROVING THE RELIABILITY OF A MEMORY HAVING A USED MEMORY REGION AND AN UNUSED MEMORY REGION

This application claims priority to German Patent Application No. 10 2005 046 981.7, which was filed on Sep. 30, 2005, and is incorporated herein by reference in its entirety.

TECHNICAL FIELD

The present invention relates to memories and methods for producing memories, such as, for example, DRAMs (dynamic random access memories).

BACKGROUND

The memory field of DRAMs consists of rows, which are also referred to as word lines (WL), and columns, which are also referred to as bit lines (BL). When a memory is accessed, a word line is at first activated. By this, the memory cells arranged in a row are each connected to a bit line in a conducting manner. Thus, the charge of the cell is divided into cell and bit line capacity. Corresponding to the ratio of the two capacities, which is also referred to as transfer ratio, this results in a deflection in the bit line voltage. At the end of the bit line, there is a sense amplifier, which is also referred to as primary sense amplifier (SA), which compares this voltage to the constant voltage on the reference bit line and subsequently amplifies same.

The memory field of DRAMs has redundant elements allowing replacement of defect cells or columns without impeding functionality of the memory chip. If the defect elements exceed the number of redundant elements, the chip will have to be discarded as being "defect." In order to minimize refusal of memory chips, one tries to sell sub-regions of chips of this kind as smaller size memory chips or lower memory capacity chips. Typically, one tries by using and repairing half the memory region to sell such a "defect" chip as a functional memory chip having half the memory size.

This kind of chip is referred to as "half good" (HG), the process is referred to as HG grading. A full capacity chip is correspondingly referred to as "full good" (FG).

There are two ways of producing HG chips, as is shown in FIG. 5. FIG. 5 shows an exemplary 256-Mbit chip comprising four memory banks bank0-bank3 each comprising a memory capacity of 64 Mbits. If the dark region marked by 1 is repairable, only these regions will be used. Instead of a 256-Mbit chip, the chip will be sold as a 128-Mbit chip. Here, it has the same functionality as a 256-Mbit chip, but a smaller memory capacity of 128 Mbits.

If the light colored region referred to by 0 is still repairable, the 128-Mbit chip will only use the light colored regions.

In order for the 128-Mbit HG chip consisting of a 256-Mbit chip to be compatible with a true 128-Mbit chip, one of the upper row addresses or one of the upper row address bits is not bonded externally, but the chip-internal pad of this row address is clamped to, for example, VCC=1 or VSS=0, depending on the area chosen.

When bit-addressing a 256-Mbit chip, the memory address has an address length of, for example, 28 bits, wherein, for example, the first two bits may be used for addressing the four memory banks and 13 bits (RA1, ..., RA13) for addressing the individual cells in the memory banks for the row address (RA), and 13 bits (CA1, ..., CA13) may be available for addressing the columns, referred to as column address (CA).

The more significant the respective address bit clamped to a fixed value, the greater the contiguous memory regions used, referred to as "used HG," and the contiguous memory regions not used, also referred to as "unused HG." Since during production, it is typically not only individual memory cells to be defect, but greater areas which are also referred to as error clusters, preferably more significant bits, such as, for example, referring to FIG. 5 the column address or column address bit CA12, are used to select the memory regions used.

More precisely, FIG. 5 thus shows the two ways of a division into used and unused memory regions on the basis of the second most significant column address bit CA12. If CA12 is internally clamped to VCC=1, the dark regions marked by 1 will form the used HG memory region, if CA12 is clamped to VSS=0 or ground (GND), the light regions marked by 0 will form the used memory region.

In order to further increase the HG yield, one may use redundant rows or word lines from the unused regions of an HG chip for repairing defect elements in the used region of the HG chip. This means that, for an HG chip using the dark region marked by 1 in FIG. 5, defect rows can be repaired by redundant rows which are physically in the light unused HG memory region.

The failure probability of semiconductors or semiconductor devices is particularly high in the first weeks after production and at the end of the lifetime, usually after some years. This is expressed by the "bathtub curve" known in semiconductor technology indicating the failure probability of a semiconductor device in dependence on the lifetime or life cycle of the semiconductor device and having a "bathtub shape," that is it decreases steeply at the beginning, then remains on a low level and increases again steeply at the end of the lifetime. In order to reduce the failure probability of the semiconductor devices in the first weeks, which is also referred to as early failure probability, the semiconductor devices are usually subjected, after production, to a so-called burn in where the devices are subjected to high voltages at high temperatures so as to "age" more quickly. Thus, failing devices may be sorted out before being delivered or used. The remaining elements are of higher reliability.

The redundant rows of unused HG regions are connected to bit lines, which are only stressed to an insufficient degree in stress tests of the 128-Mbit memory in burn in since only addressing the redundant word line causes spreading of this bit line and thus stress for the bit line. All the other word lines along a bit line, which is in the unused HG region, are not used and thus do not generate stress on the bit line.

Thus, the early failure probability discussed above of the bit lines in the unused HG region addressed by the redundant ones increases, since they do not "age" more quickly. This is illustrated in FIG. 6.

FIG. 6 shows the frequency of defects, such as, for example, bit line shorts, also referred to as "BL shorts," in defects per million (dpm) depending on time.

FIG. 6 shows the early range of the bathtub curve discussed above. The bit lines unstressed or stressed to an insufficient degree during burn in (unstressed BLs) of the unused HG memory region have a considerably higher defect frequency and thus also failure probability than the bit lines stressed during burn in (stressed BLs) of the used HG memory region. The difference is indicated as defect frequency difference (delta dpm).

Additional burn-in time cannot eliminate this problem since the bit lines in the unused HG region are not addressed sufficiently frequently. This is illustrated in FIG. 7.

FIG. 7 shows an exemplary stress ratio between bit lines in the two different memory region types, namely the used memory region (used HG region) and the unused memory region (unused HG region). FIG. 7 shows an example where, out of 1,024 word lines (WL) in the used memory region, four word lines are represented as repaired word lines and are substituted or repaired by means of the inter block repair or inter block redundancy described above by four redundant word lines of the unused memory region. Since burn in is usually performed in rows or words, the result is that the bit lines of the used memory region are stressed 1,024/4=256 times more frequently or longer during burn in than the bit lines in the unused memory region.

The result is a higher early failure rate due to short circuits on used bit lines in unused HG regions.

SUMMARY OF THE INVENTION

It one aspect, the present invention provides a method for reducing failure probability or for improving reliability of HG memories, and an HG memory of improved reliability.

In accordance with a first aspect, the invention provides a method for improving the reliability of a memory having a used memory region and an unused memory region, wherein defect memory elements in the used memory region can be substituted by memory elements in the unused memory region, the method having the steps of providing the used memory region with a first stress sequence and providing the unused memory region with a second stress sequence.

In accordance with a second aspect, the present invention provides a computer program operating in accordance with the above method.

In accordance with a third aspect, the present invention provides a memory having a used memory region and an unused memory region, wherein defect memory elements in the used memory region can be substituted by memory elements in the unused memory region, wherein the used memory region is defined by a memory-internal fixed selection value applied to an address bit of the memory and the memory has a device for inverting the selection value applied to the address bit.

A preferred embodiment in which the used memory region of the memory is defined by applying a preferably memory-internal fixed selection value to, for example, an address bit of the memory, comprises a device for inverting the fixed selection value and the step of inverting the fixed selection value, respectively, to be able to address or stress during burn in the unused memory region that cannot be addressed due to the fixed or clamped selection value.

Another preferred embodiment comprises a test bit or test mode bit by means of which the selection value applied to the address bit selected for determining the used memory region of the HG chip may, for example, be inverted by means of a logic operation. Preferably, this is caused by an equivalence function, which is also referred to as EX-NOR function, so that the used or unused memory region may be selected by a uniform value of the test bit independently of whether the selection value is set to "0" or "1."

According to another embodiment, the same stress sequence is used for both the used memory region and the unused memory region.

According to a preferred embodiment, the memory elements are further monitored or checked for defects resulting due to or during burn in by reading the memory region used by the HG chip, including the used memory elements of the memory region unused by the HG chip substituting defect memory elements of the used memory region.

One advantage of the inventive method and the inventive memory is that the increased early failure probability for the bit lines of the unused memory region is reduced and thus the reliability of the inventive memory is increased.

BRIEF DESCRIPTION OF THE DRAWINGS

Preferred embodiments of the present invention will be detailed subsequently referring to the appended drawings, in which:

FIG. 7 is an illustration of the stress ratio between bit lines of a used memory region and redundant bit lines of an unused memory region in burn in.

DETAILED DESCRIPTION OF ILLUSTRATIVE EMBODIMENTS

Figure 1:
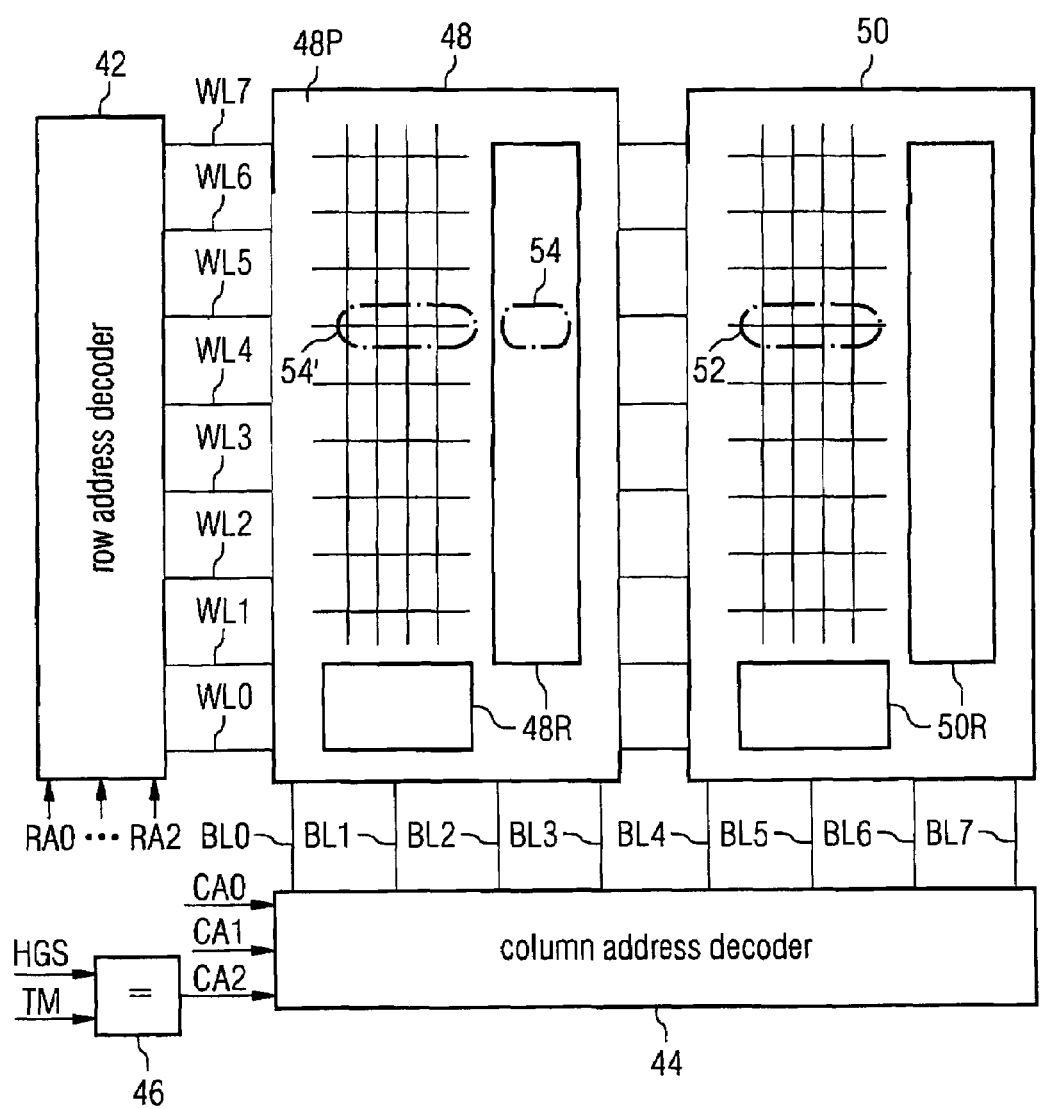
FIG. 1 shows a structure of a preferred embodiment of a memory.

FIG. 1 shows a setup of a preferred embodiment of a memory. To simplify the illustration, FIG. 1 shows a bit-oriented 64-bit memory comprising a row address decoder 42, a column address decoder 44 and an equivalence gate 46. The row address decoder 42 is formed to address one of the eight rows or word lines WL0-WL7 on the basis of a three-bit row address, which is defined by the row address bits RA0, RA1 and RA2. The column address decoder 44 is formed to address one of the eight columns or bit lines BL0-BL7 based on a column address defined by the column address bits CA0, CA1 and CA2.

In this example, the memory region 48 defined by the bit lines BL0-BL3 comprises defects that cannot be repaired by redundant elements, such as, for example, redundant rows and/or redundant columns of a redundancy memory region 48R. The defects of the memory region 50 defined by the bit lines BL4-BL7 can be repaired by redundant elements of the redundancy memory region 50R, except for the defect memory element 52, here a memory row or word line. Thus, a half-good chip having 32 bits, with the used memory region 50 and the unused memory region 48, is generated on the basis of the memory region 50, wherein the defect memory element 52 in the used memory region 50 is substituted or repaired by a redundant memory element 54 of the unused memory region 48.

The plurality of ways of repairing memories by redundant memory elements of, for example, the same memory region, are not part of this application and are thus not discussed here for the sake of an easier illustration.

The various ways of repairing defect memory elements in the used memory region by redundant memory elements in the unused memory region are not part of this application and are not discussed here for the sake of an easier illustration.

The half-good chip of FIG. I thus comprises a used memory region 50 and an unused memory region 48 and is made use of such that in normal operation the column address bit CA2 as the most significant bit (MSB) is set to "1." In order to nevertheless be able to address the unused memory region 48 for burn in, an equivalence gate is applied to the input of the column address bit CA2, wherein on the one hand the selection value HGS (HG selection) with the fixed or clamped value "1" and the test bit or test mode bit TMB are applied to the inputs of the equivalence gate 46. If TMB=1, the used memory region 50 will be addressed, if TMB=0, the unused memory region 48 will be addressed (test mode).

Thus, a preferred memory is formed such that, referring to FIG. 1, the test bit, without external control, comprises a "standard" value of "1" and thus normally only the used memory region is addressed and the value of the test bit will only be set to "0" by an external test device for the test duration for test or burn-in purposes.

Any means having an equivalence function or any means for inverting the selection value HGS may be employed as an alternative to the equivalence gate 46.

Alternatively, a defect memory element 52 of a used memory region 50 may also be repaired by a functional memory element 54' of a "primary" memory region 48P or a combination of memory elements or parts of memory elements of the primary memory region 48P and the redundancy memory region 48R. Furthermore, not only a defect memory element, but a plurality of defect memory elements of the used memory region 50 can be repaired by memory elements of the unused memory region 48.

In addition, embodiments of the invention are not limited to memories addressing individual bits, but may also be applied to memories that exemplarily address memory words of four bits, eight bits or sixteen bits as the smallest memory elements.

Figures 2, 3:
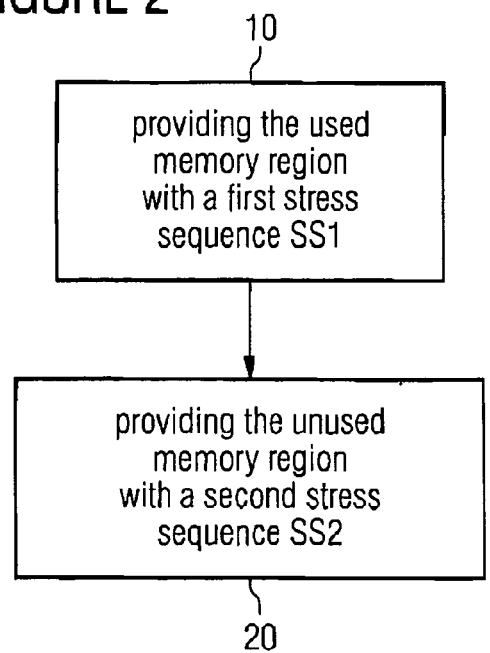
FIG. 2 is a flow diagram of the inventive method.
FIG. 3 shows a table of values of a preferred embodiment of a logical operation of the selection value and the test bit.

FIG. 2 shows a flow diagram of an embodiment of the inventive method for improving the reliability of a memory having a used memory region and an unused memory region, wherein defect memory elements in the used memory region can be substituted by functional memory elements in the unused memory region, comprising the following two steps: providing 10 the used memory region with a first stress sequence SS1 and the second step of providing 20 the unused memory region with a second stress sequence SS2, wherein the order of the two steps 10, 20 may be exchanged.

In a preferred embodiment, a test mode allows switching the HG chip having, for example, 128 Mbits to a full-good chip having, for example, 256 Mbits or switching the HG chip from the used HG memory region to the unused HG memory region. Thus, principally there is a way of stressing bit lines in the unused HG region in analogy to the full-good chip in a burn-in process following the full-good case. Thus, the increased early failure probability for the bit lines concerned may be reduced.

Since there are failing memory elements that have resulted in HG grading in the unused HG region, the unused HG regions must not be evaluated but only stressed. This means that a regular full-good burn-in program evaluating or checking all the memory elements of the 256-Mbit chip cannot be used. Using the regular full-good burn-in program is not possible either for half-good due to the missing higher column address or a fixed selection value applied to this address bit, such as, for example, the "missing" or clamped column address bit CA12 in the conventional example mentioned before referring to FIG. 5.

Figure 5:
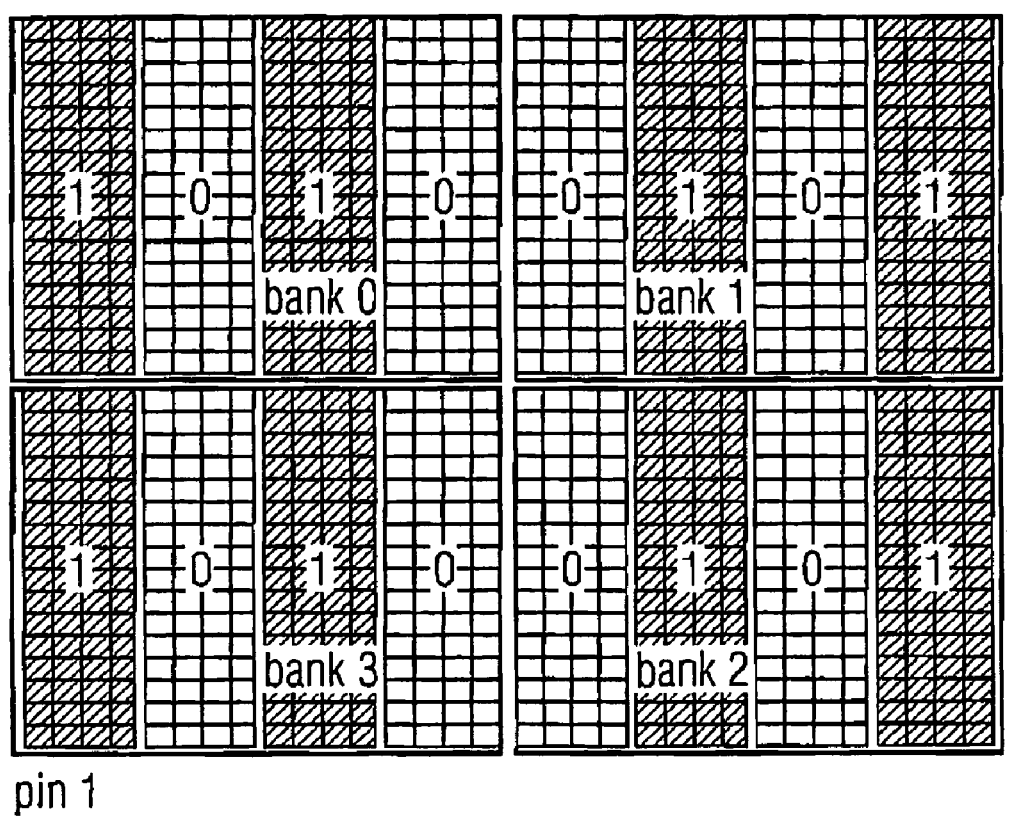
FIG. 5 shows a half-good chip according to the prior art.
Figure 6:
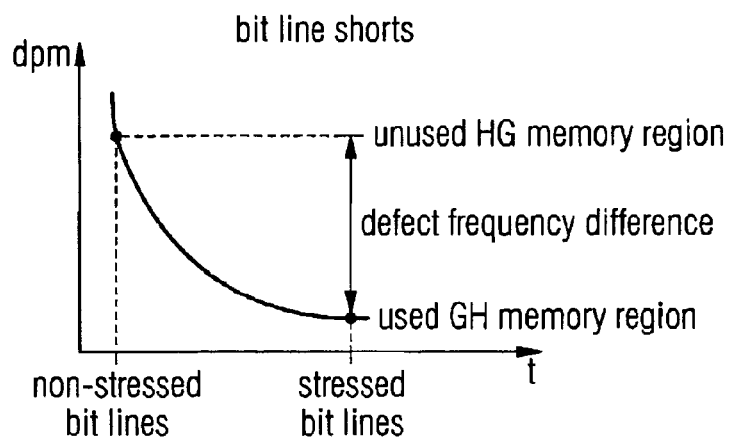
FIG. 6 shows a principle course of a defect probability in an early phase of a semiconductor device lifetime.
Figure 7:
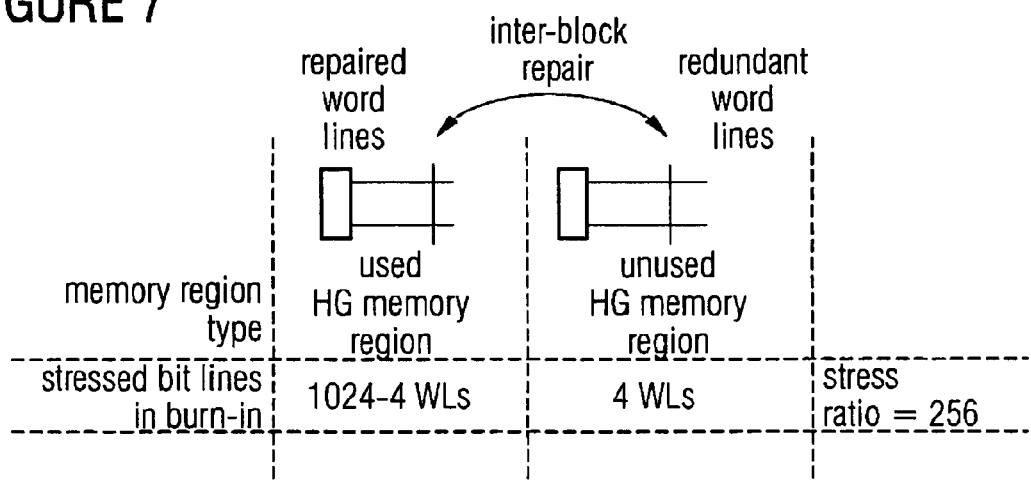

In order to be able to continue testing HG chips with different unused HG regions, dark or light or "1" or "0" in FIG. 5, simultaneously, preferred embodiments comprise a test mode extension.

Preferred embodiments of the memory thus comprise a device allowing switching per test mode bit or test bit such that switching may take place between the used HG region and the unused HG region of an HG chip. One way is to directly change the state or value of the selection value by means of the test mode bit. However, preferably the state of the test mode bit is no direct association of the selection value, such as, for example, referring to the example of FIG. 5, no direct association of the CA12 clamped state or, referring to FIG. 1, no direct association of the selection value HGS to the column address bit CA2, but an EX-NOR operation of the selection value, such as, for example, of the HGS according to FIG. 1 or, in the figurative sense, of the "CA12 clamped state" according to the example of FIG. 5, and the test mode bit state, as is illustrated in FIG. 3 and is realized in FIG. 1 by means of the equivalence gate 46.

FIG. 3 shows a table of values of a preferred logical operation of the selection value or CA12 clamped state (clamped state CA12) and the test bit or test mode bit (TM bit) to select an HG memory region (selected HG region). Thus, the test mode bit value 1 (TM bit used=1) causes the used HG region to be addressed and the test mode bit value 0 (TM bit used=0) causes the unused HG region to be addressed. The EX-NOR operation is also referred to as equivalence operation or equivalent function. The selection values or clamped states of the CA12 path and the selected HG region from the table in FIG. 3 thus correspond to the designations of FIG. 5 with VCC=1 and VSS=0.

Since the test mode will only be necessary if, for example, unused regions of the HG chips are to be addressed in burn out, only the states of the test mode bit where the TM bit value is set to 0 (TM bit used=0) is necessary for step 20 according to FIG. 2. This results in inverting the CA12 clamped state by activating the HGu test mode (HGu=half good unused).

It is to be pointed out that according to another embodiment both a positive and a negative logic may be used. In addition, any high or low values may be employed. Alternatively, an inventive memory may comprise devices having different functions allowing inverting the selection value or clamped state applied to the, for example, CA12 address bit, where a value "1" of a test mode bit, for example, causes inversion, instead of a device having an EX-NOR operation.

In addition, an inventive memory may comprise more than one "clamped" column address bit or column address bit occupied by a fixed selection value (column address bit=CA bit) to generate, for example, a "quarter good" with a memory capacity of 56 Mbits, or the HG chip may be defined by "clamping" or applying a fixed selection value to one or a plurality of row address bits (RA bits). The concept of the invention may also be applied correspondingly in theses cases.

Figure 4:
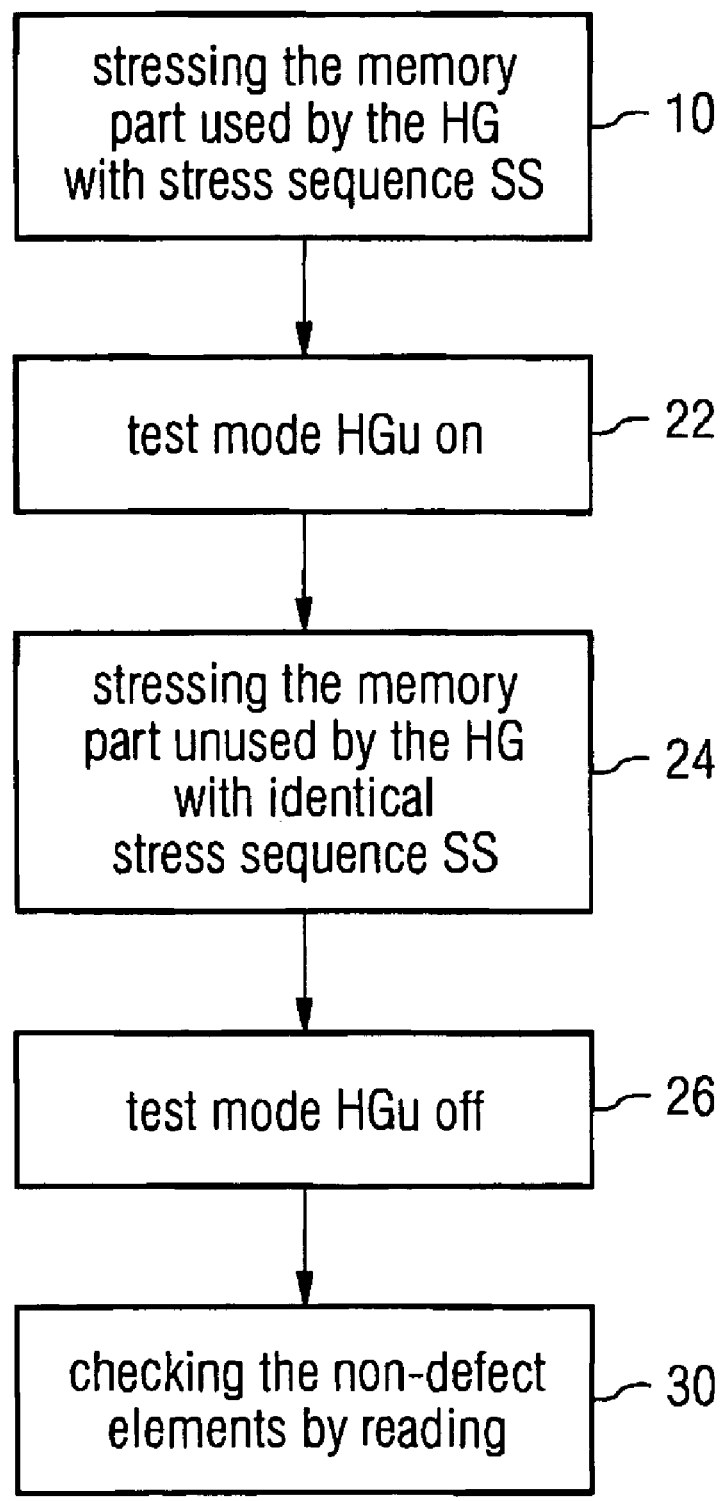
FIG. 4 is a flow diagram of another preferred embodiment of the inventive method.

FIG. 4 shows a flow diagram of a preferred embodiment of an execution sequence in the stress part of a burn-in program for a uniform bit line stress of HG chips with inter block row repair from unused HG region. In a first step 10, the memory part used by the HG chip is stressed by a stress sequence SS. After completing the stress sequence SS, what follows is a step of activating 22 the test mode HGu (test mode HGu on). This is, for example, caused by the test bit, test mode bit value=0, as is illustrated in FIG. 3. In a following step 24, the memory part unused by the HG chip is stressed by the identical stress sequence SS. After completing the stress sequence SS, what follows is a step of deactivating 26 the test mode HGu (test mode HGu off). Subsequently, checking 30 the non-defect memory elements is performed by reading the memory part used by the HG chip, including the used memory elements in the unused HG regions on the basis of inter block redundancy.

The pure burn-in stress time thus corresponds to the stress time for a full-good chip. The early failure rate risk for the bit lines of the redundant row redundancy used in the unused HG regions, however, is minimized.

In summary, it may be stated that the present invention provides an inventive concept for improving the reliability of a memory having a used memory region and an unused memory region where defect memory elements in the used memory region can be substituted by functional memory elements in the unused memory region. In a preferred embodiment, additionally an efficient concept is provided by means of which a uniform test mode or test bit value for stressing the unused memory region may be realized independently of the values or states of the selection values of the individual memories.

Depending on the circumstances, the inventive method may be implemented in either hardware or software. The implementation may be on a digital memory medium, in particular on a disc or CD having control signals, which may be read out electronically, which may cooperate with a programmable computer system such that the method will be executed. In general, embodiments of the invention thus also are in a computer program product having a program code stored on a machine-readable carrier for performing the inventive method when the computer program product runs on a computer. Put differently, embodiments of the invention may also be realized as a computer program having a program code for performing the method when the computer program runs on a computer.

While this invention has been described in terms of several preferred embodiments, there are alterations, permutations, and equivalents that fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method for operating a memory having a used memory region and an unused memory region, wherein defect memory elements in the used memory region can be substituted by memory elements in the unused memory region, comprising:
    providing the used memory region with a first stress sequence; and
    providing the unused memory region with a second stress sequence;
    wherein the used memory region is defined by applying a memory-internal fixed selection value to an address bit of the memory, wherein the fixed selection value is inverted for the step of providing the unused memory region with the second stress sequence, and
    wherein the fixed selection value is applied to the address bit via a processor having an equivalence function and is inverted by means of a test bit applied to the processor having an equivalence function.

2. The method according to claim 1, wherein the second stress sequence is the same as the first stress sequence.

3. The method according to claim 1, further comprising:
    checking the memory elements used by reading the used memory region including the memory elements of the unused memory region replacing defect memory elements of the used memory region.

4. The method according to claim 1, wherein the defect memory elements in the used memory region replaced by memory elements in the unused memory region are rows.

5. The method according to claim 1, wherein the memory elements in the unused memory region replacing defect memory elements in the used memory region are redundant memory elements.

6. A computer program having a program code for executing a method for operating a memory having a used memory region and an unused memory region, wherein defect memory elements in the used memory region can be substituted by memory elements in the unused memory region, comprising:
    providing the used memory region with a first stress sequence, and
    providing the unused memory region with a second stress sequence, when the computer program runs on a computer,
    wherein the used memory region is defined by applying a memory-internal fixed selection value to an address bit of the memory, wherein the fixed selection value is inverted for the step of providing the unused memory region with the second stress sequence, and wherein the fixed selection value is applied to the address bit via a processor having an equivalence function and is inverted by means of a test bit applied to the processor having an equivalence function.

7. A memory comprising:
    a used memory region;
    an unused memory region, wherein defect memory elements in the used memory region can be substituted by functional memory elements in the unused memory region;
    a device for inverting a memory-internal fixed selection value applied to the address bit of the memory; and
    the used memory region being defined by the selection value applied to the address bit of the memory,
    wherein the device for inverting is a processor having an equivalence function, and wherein the memory-internal fixed selection value is applied to the address bit via the processor and is inverted by means of a test bit applied to the processor having an equivalence function.

8. The memory according to claim 7, wherein the functional memory elements in the unused memory region replacing defect memory elements in the used memory region are redundant memory elements.

9. The memory according to claim 8, wherein the redundant memory elements are rows.

10. The memory according to claim 8, wherein the functional memory elements in the unused memory region replacing defect memory elements in the used memory region are rows of memory elements.

* * * * *